United States Patent [19]

Masterton

[11] Patent Number: 5,738,269
[45] Date of Patent: Apr. 14, 1998

[54] METHOD FOR FORMING A SOLDER BUMP

[75] Inventor: Patrick J. Masterton, Carol Stream, Ill.

[73] Assignee: Motorola, Inc., Schaumburg, Ill.

[21] Appl. No.: 635,111

[22] Filed: Apr. 19, 1996

[51] Int. Cl.[6] .................... H01L 21/60; H05K 3/34
[52] U.S. Cl. ........................ 228/248.1; 228/254
[58] Field of Search ................... 228/248.1, 37, 228/180.21, 180.22, 214, 254

[56] References Cited

U.S. PATENT DOCUMENTS

| | | | |
|---|---|---|---|
| 4,339,768 | 7/1982 | Keller et al. | 357/72 |
| 4,413,309 | 11/1983 | Takahashi et al. | 228/180.21 |
| 5,024,372 | 6/1991 | Altmann et al. | 228/248.1 |
| 5,043,796 | 8/1991 | Lester | 357/71 |
| 5,133,495 | 7/1992 | Angulas et al. | 228/248.1 |
| 5,261,593 | 11/1993 | Casson et al. | 228/248.1 |
| 5,395,040 | 3/1995 | Holzmann | 228/254 |
| 5,400,950 | 3/1995 | Myers et al. | 228/248.1 |
| 5,477,086 | 12/1995 | Rostoker et al. | 257/737 |
| 5,558,271 | 9/1996 | Rostoker et al. | 228/180.22 |
| 5,598,967 | 2/1997 | Greenwood et al. | 228/254 |

*Primary Examiner*—Samuel M. Heinrich
*Attorney, Agent, or Firm*—Heather L. Creps

[57] ABSTRACT

The solder bump apparatus includes a substantially conductive region (14) and a slot (16) projecting from the substantially conductive region (14). A solder resist region (12) at least in part surrounds a perimeter of the substantially conductive region (14) and a perimeter of the slot (16). A solder bump (22) is formed on the conductive region (14) and at least a portion of the solder resist region (12).

10 Claims, 2 Drawing Sheets

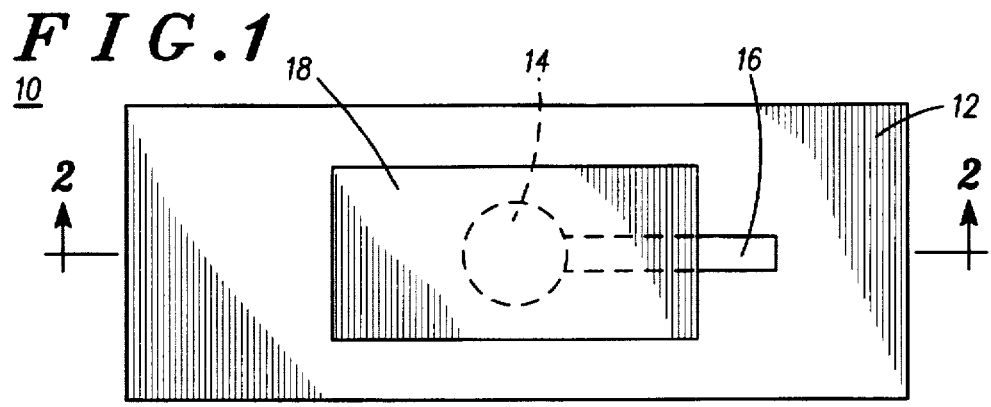
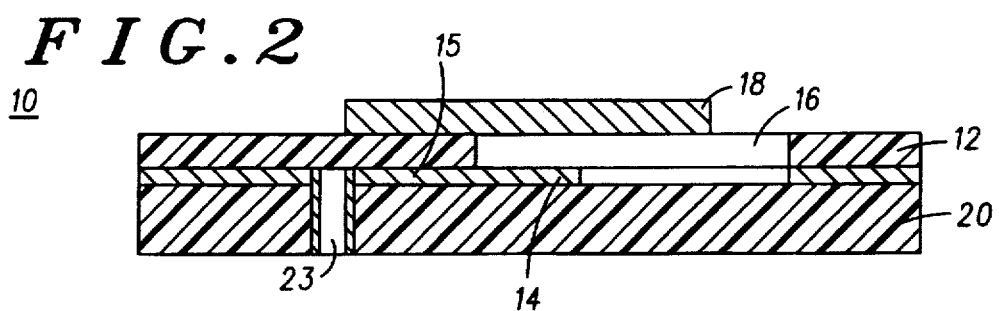
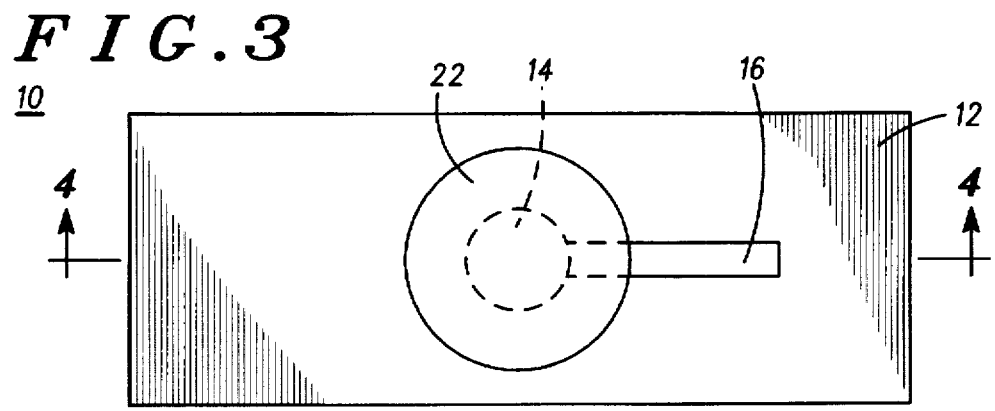
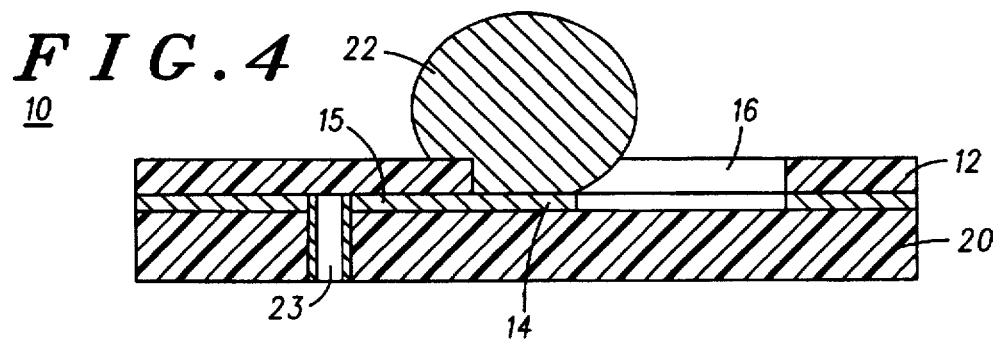

METHOD FOR FORMING A SOLDER BUMP

FIELD OF THE INVENTION

This invention relates generally to solder connections, and, more particularly, to a solder bump apparatus, an electronic component and a method for forming a solder bump.

BACKGROUND OF THE INVENTION

Solder bumps are frequently attached to conductive regions, or solder pads, of an electronic component such as an integrated circuit or a circuit board to allow for surface mounting of the electronic component.

Pre-formed solder bumps may be automatically positioned on pre-fluxed solder pads using a variety of well-known techniques, including robotic pick-and-placing and screen-printing methods. Solder bump placement is frequently followed by a reflow operation, which secures the solder bumps to the solder pads.

Solder bumps may also be formed from a solder paste, which includes both a solder alloy and a flux, applied to solder pads prior to the reflow operation. As the solder paste is brought through the reflow process, the solder alloy "balls up" and forms a solder bump.

Flux activates and disperses during the reflow process, removing surface contaminants from both the solder bumps and the solder pads and ensuring that the solder bumps attach firmly to the solder pads. During the flux activation and dispersion process, however, the solder bumps may move with the flux, and separate from the solder pads. In addition, the flux may become trapped between the solder bumps and the solder pads, resulting in weak solder bump-to-solder pad attachments.

There is therefore a need for a solder bump method and apparatus which enhances the accurate positioning of solder bumps over solder pads and which increases the reliability of connections between solder bumps and solder pads.

SUMMARY OF THE INVENTION

According to an aspect of the present invention, the foregoing need is addressed by a solder bump apparatus which includes a substantially conductive region and a slot projecting from the substantially conductive region. A solder resist region at least in part surrounds a perimeter of the substantially conductive region and a perimeter of the slot. A solder bump is formed on the conductive region and at least a portion of the solder resist region.

According to another aspect of the present invention, an electronic component includes a dielectric region, a substantially conductive region disposed on the dielectric region, a solder resist region proximate the substantially conductive region, a slot formed by removing material from the substantially conductive region and the dielectric region, and a solder bump coupled to the conductive region, covering at least a portion of the solder resist region and the slot.

According to a further aspect of the present invention, a method for forming a solder bump includes providing a device having a substantially conductive region, a slot projecting from the substantially conductive region, and a solder resist region, the solder resist region at least in part surrounding the conductive region and the slot; depositing a volume of solder paste onto the device, the solder paste comprising a solder and a flux, the solder paste substantially covering the conductive region and at least a portion of the solder resist region; and heating the solder paste to form the solder bump on the conductive region and at least a portion of the solder resist region.

Advantages of the present invention will become readily apparent to those skilled in the art from the following description of the preferred embodiment(s) of the invention which have been shown and described by way of illustration. As will be realized, the invention is capable of other and different embodiments, and its details are capable of modifications in various respects. Accordingly, the drawings and description are to be regarded as illustrative in nature, and not as restrictive.

BRIEF DESCRIPTION OF THE DRAWINGS

FIG. 1 is a plan view of a bonding region of an electronic component, according to a preferred embodiment of the present invention.

FIG. 2 is a cross-sectional view along line 2—2 of the bonding region depicted in FIG. 1.

FIG. 3 is a plan view of the bonding region of the electronic component depicted in FIGS. 1 and 2, depicting solder bumps formed during a reflow process.

FIG. 4 is a cross-sectional view along line 4—4 of the bonding region depicted in FIG. 3.

DETAILED DESCRIPTION OF THE PREFERRED EMBODIMENTS

Figure 5:
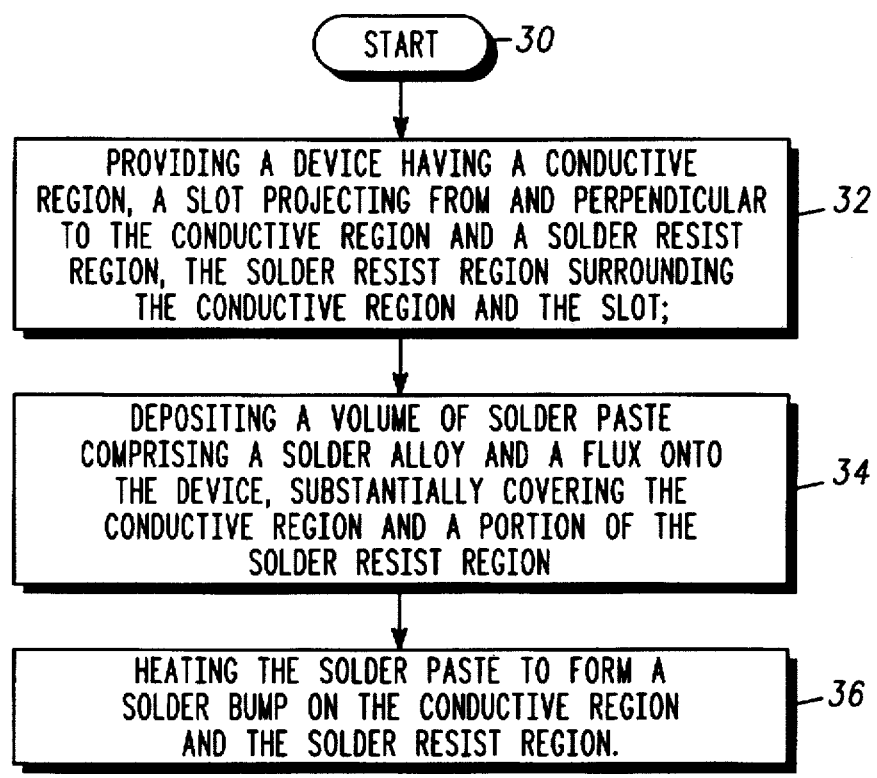
FIG. 5 is a flowchart of a method for forming a solder bump according to a preferred embodiment of the present invention.

Turning now to the drawings, wherein like numerals designate like components, FIG. 1 is a plan view of a bonding region of an electronic component, according to a preferred embodiment of the present invention. Bonding region 10 may be attached to, or be an integral part of, an electronic component (not shown) such as an integrated circuit chip or a printed circuit board, among other things. It is contemplated that a plurality of bonding regions 10 may be present on a single electronic component. In one example, thirty-one bonding regions 10 are disposed on one electronic component.

As shown in FIG. 1, bonding region 10 includes a solder resist region 12, solder resist materials being well-known and widely available; a conductive region 14, which may be, for example, a solder pad made of a metallic material such as copper; a slot 16 and a solder paste region 18, which comprises a volume of solder paste.

Slot 16 projects from, and may be substantially perpendicular to, solder pad 14. Slot 16 may be any desired shape, for example, circular, rectangular or elliptical, and may be formed in any suitable manner, for example, using a laser. Solder resist region 12 preferably surrounds both solder pad 14 and slot 16. Solder paste 18 covers solder pad 14, extending partially onto solder resist region 12 and partially over slot 16.

Bonding region 10 may be constructed in a variety of ways. One example of a suitable construction for bonding region 10 is shown in FIG. 2. As illustrated, solder pad 14 is an exposed region of a larger conductive layer 15 disposed on a dielectric region 20, which may be a substrate such as ceramic or another material. A layer of solder resist 12 may be disposed over conductive layer 15 and may be selectively removed to form solder pad 14. Slot 16 extends through solder resist region 12 and conductive layer 15, so that substrate 20 is exposed. A via hole 23 through substrate 20 may electrically connect solder pad 14 with a component (not shown) on an opposite side (not shown) of bonding region 10, typically to a component of an integrated circuit.

Solder paste 18 is preferably screen-printed onto bonding region 10 using commonly-known techniques, using, for example, a stencil (not shown) and a squeegee (not shown). The stencil, which may be metal, suitable metals including but not limited to stainless steel, brass or copper, has apertures therein which may be formed by punching, drilling or etching, for example. Preferably, an aperture in the stencil corresponds to a location of solder pad 14 on bonding region 10. It is contemplated that where multiple bonding regions 10 are present, the stencil may have multiple corresponding apertures. It is further contemplated that solder paste 18 may be applied via the stencil to a number of groups of bonding regions 10 simultaneously, for example, where a number of electronic components are formed on a single substrate 20. In one example, solder paste 18 is applied to fourteen electronic components, each electronic component having thirty-one bonding regions 10.

To deposit solder paste 18 onto bonding region 10, the stencil is placed over solder pad 14, and the squeegee forces solder paste 18 through the stencil and onto solder pad 14. Solder paste 18 may be printed in any desired shape, for example, rectangular or cylindrical or another shape. As shown in FIGS. 1 and 2, solder paste 18 is rectangular in shape.

In general, solder paste 18 includes at least three functional components: a solder alloy, a flux, and a vehicle, typically a solvent suitable for dissolving fluxes. Generally, the flux is activated at a temperature lower than a melting temperature of the solder alloy. The composition of solder paste 18 should be selected based upon solderability and joint integrity requirements.

There are a wide range of suitable solder paste materials which are well-known in the solder connection field that would be suitable for use on bonding region 10 described herein. One suitable solder paste is commercially available from Alphametals, located at 600 Route 440, Jersey City, N.J. 07304, part number RMA390DH4, which contains about ninety percent solder alloy, which in turn is composed of approximately sixty-two percent tin, approximately thirty-six percent lead and approximately two percent silver, and about five percent flux, with the remainder being vehicle.

As shown in FIGS. 1 and 2, the volume of solder paste 18 is approximately 0.78 cubic millimeters. The size of solder paste region 18 should be chosen based on the desired size of the final solder bump (discussed further below). A preferred solder paste-to-solder bump volume ratio is seven-to-one. A high solder paste-to-solder bump volume ratio may reduce sensitivity to small changes in the position of solder paste 18 with respect to the location of the final solder bump, and also may help to ensure that small variations in the volume of solder paste will have a reduced impact on the size of the final solder bump.

FIGS. 3 and 4 are views of the bonding region of the electronic component depicted in FIGS. 1 and 2, illustrating solder bumps 22 formed from solder paste 18 during a reflow operation. A solder bump may be formed during reflow from solder paste 18 in several steps. First, solder paste 18 is heated to a temperature lower than the melting temperature of the solder alloy component of solder paste 18 for a period of time. The heating temperature and period of time are chosen so as to substantially activate the flux component of solder paste 18 and to provide a sufficient amount of time for the flux to perform its functions and to disperse.

Although there are many temperatures associated with the melting point of the solder alloy, a temperature range of about 179 to 183 degrees Celsius may be suitable. There are likewise various suitable periods of time associated with the activation of the flux. One preferred reflow process would provide that solder paste 18, composed of about ninety percent solder alloy and about five percent flux, among other things, be heated for approximately two minutes within a temperature range of approximately 150 to 172 degrees Celsius.

During the flux activation process, the flux component of solder paste 18, which might otherwise remain trapped between solder bump 22 and solder pad 14, flows into slot 16, in part because of the flux's attraction to dielectric substrate 20, increasing the reliability of the connection between solder bump 22 and solder pad 14. In addition, slot 16 captures excess flux flowing from solder resist region 12, inhibiting the tendency of solder paste 18 or solder bump 22 to become dislodged, and aiding in accurate solder bump 22-to-solder pad 14 positioning.

To complete the reflow process, solder paste 18 may be heated around the melting point of the solder alloy, for example, within a temperature range of approximately 178 to 183 degrees Celsius, which causes the solder alloy to "ball up" and form solder bump 22 over solder pad 14, the solder alloy being attracted to conductive solder pad 14. It may also be desirable to heat to a higher temperature, for example, to around 218 degrees Celsius, to improve the quality of the solder joint. As shown in FIG. 4, solder bump 22 extends over at least a portion of solder resist region 12 and at least a portion of slot 16.

Although it is contemplated that the techniques described herein could be applied to a wide range of solder bump dimensions and spacings, in a preferred embodiment, solder bump 22 measures 0.18 millimeters in diameter, and may be formed within approximately 1.4 millimeters of an adjacent solder bump (not shown).

Thus, it is seen that, as illustrated in FIG. 5 starting at block 30, a method for forming a solder bump may include a first step 32 of providing a device having a substantially conductive region, a slot projecting from and substantially perpendicular to the substantially conductive region, and a solder resist region, the solder resist region at least in part surrounding the conductive region and the slot. A next step 34 includes depositing a volume of solder paste comprising a solder alloy and a flux onto the device, substantially covering the conductive region and a portion of the solder resist region. A final step 36 involves heating the solder paste to form a solder bump on the conductive region and the solder resist region.

Using the apparatus and method herein described, process defects and tooling costs are reduced. Accurate solder bump-to-solder pad registration is obtained using a dielectric slot, which wicks away excess flux during the reflow process and helps to correct misalignment and enhance solder joint integrity between the solder bump and solder pad, without expensive tools such as robotics.

It will be apparent that other and further forms of the invention may be devised without departing from the spirit and scope of the appended claims and their equivalents, and it will be understood that this invention is not to be limited in any manner to the specific embodiments described above, but will only be governed by the following claims and their equivalents.

I claim:

1. A method for forming a solder bump, comprising the steps of:

providing a device having a substantially conductive region, a slot projecting from the substantially conductive region, and a solder resist region, the solder resist region at least in part surrounding the conductive region and the slot;

depositing a volume of solder paste onto the device, the solder paste comprising a solder and a flux, the solder paste substantially covering the conductive region and at least a portion of the solder resist region;

heating the solder paste to a temperature below a melting point of the solder for at least one minute, at least a portion of the flux flowing from the substantially conductive region into the slot; and after the flux has become substantially inactive, heating the solder paste at at least a melting point of the solder to form the solder bump on the conductive region and at least a portion of the solder resist region.

2. The method according to claim 1, further comprising the step of:

prior to heating the solder paste to form the solder bump, heating the solder paste to a temperature below a melting point of the solder, at least a portion of the flux flowing from the solder resist region into the slot.

3. The method according to claim 2, wherein the temperature is approximately 150 to 172 degrees Celsius.

4. The method according to claim 1, further comprising the step of:

attaching the solder bump to a circuit board.

5. The method according to claim 1, wherein the volume of solder paste is greater than five times larger than a volume of the solder bump.

6. The method according to claim 1, wherein a shape of the volume of solder paste is selected from the group consisting essentially of: rectangular and cylindrical.

7. The method according to claim 1, wherein the solder paste is deposited over at least a portion of the slot.

8. The method according to claim 1, wherein the solder resist region has a thickness less than 10 millimeters.

9. The method according to claim 1, wherein the slot comprises a dielectric region.

10. The method according to claim 1, wherein a cross-sectional shape of the slot is selected from the group consisting essentially of: rectangular and elliptical.

* * * * *